United States Patent [19]

Aarts

[11] Patent Number: 4,613,961
[45] Date of Patent: Sep. 23, 1986

[54] OPTICAL READER WITH A LIMITER IN THE TRACKING OR FOCUS ERROR SERVO CONTROL LOOP

[75] Inventor: Ronaldus M. Aarts, Eindhoven, Netherlands

[73] Assignee: U.S. Philips Corporation, New York, N.Y.

[21] Appl. No.: 487,781

[22] Filed: Apr. 22, 1983

[30] Foreign Application Priority Data

Jan. 27, 1983 [NL] Netherlands .................. 8300291

[51] Int. Cl.$^4$ .................. G11B 7/09; G11B 7/16
[52] U.S. Cl. ........................... 369/44; 369/45; 250/201; 318/635
[58] Field of Search .............. 369/43, 44, 45, 46; 250/201 DF; 318/635

[56] References Cited

U.S. PATENT DOCUMENTS

| | | | |
|---|---|---|---|
| 3,424,402 | 1/1969 | Bulloch et al. | 244/1 |
| 3,942,087 | 3/1976 | Maisch et al. | 318/587 |
| 4,074,312 | 2/1978 | van Rosmalen | 358/128 |
| 4,152,586 | 5/1979 | Elliot et al. | 250/201 |
| 4,243,850 | 1/1981 | Edwards | 369/46 |
| 4,280,215 | 7/1981 | Okano | 369/45 |
| 4,290,132 | 9/1981 | Kotaka | 369/45 |
| 4,344,165 | 8/1982 | Akiyama | 369/44 |
| 4,357,696 | 11/1982 | Bierhoff et al. | 369/45 |
| 4,381,557 | 4/1983 | Jebens | 369/45 |
| 4,385,373 | 5/1983 | Howe | 369/45 |
| 4,414,655 | 11/1983 | Shoji et al. | 369/44 |
| 4,497,048 | 1/1985 | Kimura | 369/46 |

Primary Examiner—Raymond F. Cardillo
Assistant Examiner—Wayne R. Young
Attorney, Agent, or Firm—Robert T. Mayer; Algy Tamoshunas

[57] ABSTRACT

Faults in servo control systems as a result of, for example, signal spikes caused by defects such as thickness variations, air bubbles, and scratches and dust particles on the substrate of the record carrier in an apparatus for reading an optical record carrier, can be suppressed effectively by arranging a limiter in the servo control system of such an apparatus. Suitably, the limiter has an adaptive nature, i.e. the limiting levels are adapted to the amplitude of the servo signal.

5 Claims, 4 Drawing Figures

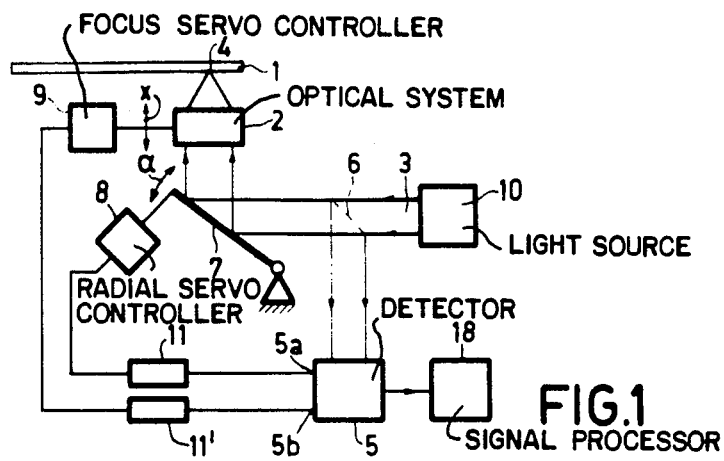
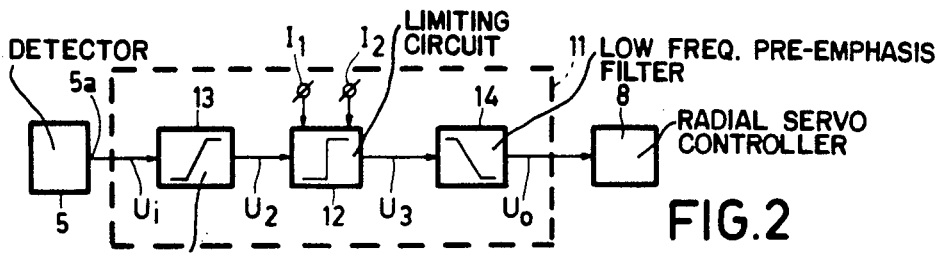
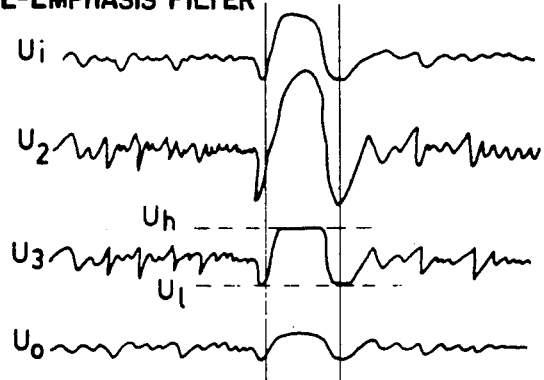
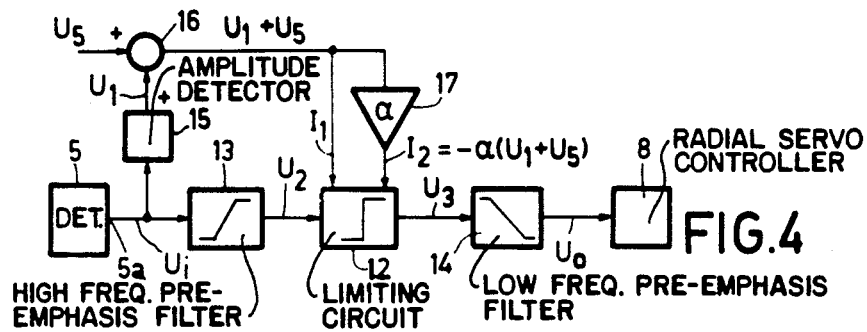

OPTICAL READER WITH A LIMITER IN THE TRACKING OR FOCUS ERROR SERVO CONTROL LOOP

The invention relates to an apparatus for reading an optical record carrier, which apparatus comprises:

an optical system for projecting a read beam so as to form a scanning spot on the record carrier, a read detector for detecting the information contained in the read beam after it has cooperated with the record carrier, and a control circuit for controlling a control quantity which influences the scanning spot, which control circuit comprises a detector for generating an error signal and a servo control device for controlling the control quantity depending on said error signal.

A read apparatus for optical record carriers generally comprises various servo systems which influence the scanning spot. For example, U.S. Pat. No. 3,854,015 comprehensively describes the servo system which controls the radial position of the scanning spot, in other words the servo system which keeps the scanning spot correctly centered on the track. In addition to this radial servo system, such a read apparatus also includes a focusing servo system which ensures that the read beam remains in focus on the information surface of the record carrier. A multitude of possible variants of such servo control systems in apparatus for reading optical record carriers are described in the literature.

In practice it has been found that these servo control systems are not immune to spurious signals. This is highly undesirable since the occurrence of a fault in one of these control systems also disturbs the read-out of the record carrier.

It is the object of the invention to provide a read apparatus for optical record carriers which substantially improves the immunity of the servo control systems to spurious signals. To this end the invention is characterized in that the control circuit comprises a limiter which is arranged between the detector and the servo control device for limiting peak-shaped spurious signals in the error signal supplied by the detector.

The invention is based on the recognition that said faults in the servo control systems are mainly caused by signal spikes as a result of defects in the substrate of the record carrier such as variations in its thickness, air bubbles, or scratches and dust particles on the substrate of the record carrier. By arranging a limiter in such a servo control system in accordance with the invention, it is possible to eliminate the influence of these signal spikes. The limiting levels of this limiter will be situated just outside the normal range of the error signals, so that spurious signals which exceed this range are strongly suppressed.

Since the signal spikes contain large amounts of higher frequencies, the apparatus in accordance with the invention is preferably characterized in that a high frequency pre-emphasis filter is arranged between the detector and the limiter. Thus, before they are applied to the limiter, the spurious signals are boosted in comparison with the normal error signals, yielding a more effective suppression of these spurious signals in the limiter. A further preferred embodiment of the apparatus in accordance with the invention is characterized in that the limiter comprises at least one control input for adjusting the limiting levels in dependence on a control signal on said control input, which control input is coupled to an amplitude detector for supplying the control signal depending on the amplitude of the error signal. In this embodiment, the limiting levels of the limiter are adapted automatically to the amplitude of the error signal, so that an effective suppression of the spurious signals is possible independently of this amplitude. Thus, as a result of the time constant of the amplitude detector, this yields an adaptive control of the limiting levels of the limiter.

The invention will now be described in more detail, by way of example, with reference to the Figures, in which FIG. 1 shows an apparatus for reading an optical record carrier, FIG. 2 shows a first embodiment of the apparatus in accordance with the invention, FIG. 3 shows voltage waveforms on the various points of the circuit, and FIG. 4 shows a second embodiment of the apparatus in accordance with the invention.

FIG. 1 schematically shows an apparatus for reading an optical record carrier 1. The apparatus comprises a light source 10 which emits a read beam 3 which via a movable mirror 7 and an optical system 2 is projected on the record carrier 1 as a scanning spot 4. It is assumed that the record carrier reflects the incident beam for the most part. The reflected radiation beam then passes again through the optical system 2 and the movable mirror 7 and subsequently it is deflected towards the detector 5 by the semi-transparent mirror 6. This detector 5 comprises a read detector which detects the information present in the read beam and converts it into an electric signal which is further processed in a processing unit 18. In addition, detector 5 comprises detection systems for detecting, inter alia, the radial position of the scanning spot 4 relative to the desired track and the focusing of the scanning spot. Versions of detection systems suitably for this purpose are known from the literature and are therefore not described in more detail. By way of illustration reference is made to the U.S. Pat. Nos. 3,876,842 and 3,934,080. For simplicity, the Figure only shows that detector 5 comprises two outputs 5a and 5b on which a radial error signal and a focusing error signal become available respectively. The radial error signal is applied to a servo control device 8 by means of which the position of the mirror 7 is controlled. The focusing error signal is applied to a servo control device 9 which controls the position of the optical system relative to the disc and thus the focusing of the read beam. In accordance with the invention one of the two or both control circuits comprises a limiter, 11 and/or 11', respectively arranged between the detector 5 and the servo control device 8 and/or between the detector 5 and the servo control device 9.

A possible version of this limiter is shown in FIG. 2. By way of illustration, only the limiter 11 is shown in more detail, which limiter is arranged between the output 5a of the detector 5 and the input of the servo control device 8 for controlling the pivotal position of the mirror 7, but the limiter 11' in FIG. 1 may be of a similar design. The actual limiting circuit, designated 12, receives its signal from the detector 5 either directly or via a high-frequency pre-emphasis filter 13 and after limiting transfers this signal to the servo control device 8 either directly or via a low-frequency pre-emphasis filter 14. The limiting levels have been selected in such a way that only spurious pulses are limited, but not the error signal. In the case of a variable error signal it is advantageous to adapt the limiting levels. Therefore, the limiter 12 is provided with one or more control inputs $I_1$ and/or $I_2$.

For a better understanding of this circuit arrangement FIG. 3 shows how the voltage on the various points of the circuit of FIG. 2 vary as a function of time. If the signal $U_i$ on the output 5a of the detector 5 is disturbed by a brief, strong amplitude increase, this excessive amplitude can be limited by the limiter 12. For purpose this limiter 12 has limiting levels $U_h$ and $U_l$ which are situated just above the maximum amplitudes of the normal error signal, i.e. the error signal caused by tracking errors. Since in practice the amplitudes of the error signal vary substantially, it is advantageous if the error signal with the spurious component is amplified selectively in a high-frequency pre-emphasis filter 13. In this filter the brief spurious pulses which contain many high frequencies are amplified to a greater extent than the error signals of lower frequency, as is shown by the output signal $U_2$ of the filter 13. After limiting the excessive amplitudes have disappeared from the signal (see $U_3$ in FIG. 3), so that the spurious components are also eliminated. If a slight distortion of the original error signal $U_i$ is to be eliminated and the residual error signal is to be attenuated even further, the output signal $U_3$ of the limiting circuit should also be passed through a low-frequency pre-emphasis filter 14, whose frequency response is preferably the complement of that of the high-frequency pre-emphasis filter 13, which results in the signal $U_0$.

In the case of a fairly constant amplitude of the error signal, the limiting levels $U_h$ and $U_l$ may be fixed levels. In the case of stronger variations of the average amplitude of the error signal, the limiting levels would have to be situated comparatively far apart to allow the strongest error signal to pass without being limited, which means that in the case of weak error signals, the immunity to spurious signals deteriorates. This may be precluded by making the limiting levels variable, which in more sophisticated version may be effected automatically, so that the limiter has an adaptive nature.

FIG. 4 shows such an adaptive limiter. It operates as follows. The amplitude $U_l$ of the error signal $U_i$ from the detector 5 is determined by the amplitude detector 15 and is stored for a time $\tau$. Since spurious signals are very short, they hardly affect this value $U_1$. In a summation circuit 16, a voltage $U_5$ is added to the output voltage $U_1$ of the detector in view of a correct adjustment of the complete system, thereby defining a first level, for example $U_h = U_1 + U_5$, of the limiter. Via an inverting amplifier 17, the other control input $I_2$ of the limiter also receives its control signal from the output of the summation circuit 16, so that $U_l = -\alpha(U_1 + U_5)$. The two limiting levels $U_l$ and $U_h$ now contain a component $U_1$, which depends on the amplitude of the error signal, so that the limiting levels are adapted automatically to the amplitude of the error signal. The rate of adaptation is dictated by the time constant $\tau$, whilst the two limiting levels can be set asymmetrically by means of the amplifier 17.

Finally, it is to be noted that the invention is not limited to the embodiments described herein.

What is claimed is:

1. An apparatus for reading an optical record carrier, which apparatus comprises an optical system for projecting a read beam so as to form a scanning spot on the record carrier, a read detector for detecting information contained in the read beam after it has cooperated with the record carrier, and a control circuit for controlling a control quantity which influences the scanning spot, which control circuit comprises means for generating an error signal, a servo control device for controlling the control quantity depending on said error signal, and a limiter which is arranged between the error signal generating means and the servo control device, for limiting peak-shaped spurious signals in the error signal, said limiter comprising at least one control input for adjusting the limiting level depending on a control signal on said control input, and an amplitude detector, coupled to said control input, for supplying the control signal in dependence on the amplitude of the error signal.

2. An apparatus as claimed in claim 1, characterized in that a high-frequency pre-emphasis filter is arranged between the detector and the limiter.

3. An apparatus as claimed in claim 1 or 2, wherein the limiter comprises a first and a second control input for individually defining two limiting levels depending on a first and a second control signal, which two control inputs are coupled to said amplitude detector for supplying the control signals depending on the amplitude of the error signal, and including an amplifier arranged between said amplitude detector and the second control input of the limiter.

4. An apparatus as claimed in claim 3, including a summation circuit arranged between the amplitude detector and the limiter, for adjusting a d.c. component in the output signal of the amplitude detector.

5. An apparatus as claimed in claim 2 or 4, including a low-frequency pre-emphasis filter arranged between the limiter and the servo control device.

* * * * *